United States Patent [19]
Koyama

[11] Patent Number: 5,447,883
[45] Date of Patent: Sep. 5, 1995

[54] METHOD OF MANUFACTURING SEMICONDUCTOR DEVICE

[75] Inventor: Kuniaki Koyama, Tokyo, Japan

[73] Assignee: NEC Corporation, Tokyo, Japan

[21] Appl. No.: 329,860

[22] Filed: Oct. 27, 1994

[30] Foreign Application Priority Data

Oct. 29, 1993 [JP] Japan ............... 5-271723

[51] Int. Cl.6 .......................................... H01L 21/76
[52] U.S. Cl. ......................................... 437/61; 437/67; 437/68; 437/72; 437/78; 437/79; 427/228
[58] Field of Search ........... 437/61, 67, 68, 72, 437/78, 79; 427/228

[56] References Cited

U.S. PATENT DOCUMENTS

| | | | |
|---|---|---|---|
| 5,108,946 | 4/1992 | Zdebel et al. | 437/72 |
| 5,116,779 | 5/1992 | Iguchi | 437/61 |
| 5,190,889 | 3/1993 | Poon et al. | 437/61 |

FOREIGN PATENT DOCUMENTS

| | | |
|---|---|---|
| 0120614 | 10/1984 | European Pat. Off. ........ 437/61 |
| 60-224242 | 11/1985 | Japan . |
| 63-37631 | 2/1988 | Japan . |
| 6-21210 | 1/1994 | Japan . |

*Primary Examiner*—Hoa Van Le
*Attorney, Agent, or Firm*—Sughrue, Mion, Zinn, Macpeak & Seas

[57] ABSTRACT

A $p^+$-diffusion layer is formed on a surface of a p-type silicon substrate in self-alignment with a groove 7 defined in the p-type silicon substrate, and a thin insulating film is formed on the groove and the $p^+$-diffusion layer in self-alignment therewith, the thick insulating film having side walls. A self-aligned $n^+$-diffusion layer has terminal edges spaced from terminal edges of the $p^+$-diffusion layer for minimizing any leakage current flowing between these terminal edges.

2 Claims, 10 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device with elements isolated by an insulating film.

2. Description of the Prior Art

Recent efforts which have been made to fabricate highly integrated semiconductor devices have been accompanied by attempts to reduce gate dimensions of MOS transistors and device dimensions such as aluminum interconnection widths, and also to reduce element isolation area widths with greater importance. Processes for isolating elements with grooves or selective epitaxy are well known in the art for semiconductor devices having a high element density.

One conventional process of diffusion in a groove is to introduce an impurity into the side walls of the groove as disclosed in Japanese laid-open patent publication No. 63-37631.

FIG. 2 of the accompanying drawings shows a structure for suppressing a leakage current in the side walls of a groove as disclosed in Japanese laid-open patent publication No. 21210/94. FIGS. 1a through 1g of the accompanying drawings show in cross section sequential steps of a process for manufacturing the semiconductor device disclosed in Japanese laid-open patent publication No. 21210/94.

The manufacturing process shown in FIGS. 1a through 1g will be described below. As shown in FIG. 1a, a silicon oxide film 2 having a thickness of about 20 nm is formed as a first insulating film 2 on a p-type silicon substrate 1 by thermal oxidization, and then a polycrystalline silicon film 3 having a thickness of about 200 nm is deposited as a first polycrystalline silicon film on the silicon oxide film 2 by chemical vapor deposition (CVD). Thereafter, a CVD silicon oxide film 14 having a thickness of about 100 nm is deposited as a second insulating film on the polycrystalline silicon film 3, following which a polycrystalline silicon film 15 having a thickness of about 100 nm is deposited as a second polycrystalline silicon film on the silicon oxide film 14. A photoresist 4 is then deposited on the polycrystalline silicon film 15 to cover areas other than an element isolation area.

Thereafter, using the photoresist 4 as a mask, portions of the polycrystalline silicon film 15, the silicon oxide film 14, and the polycrystalline silicon film 3 are successively etched away, thus forming an opening with the silicon oxide film 2 exposed at the bottom thereof. Using the photoresist 4 also as a mask, ions of boron are injected into the surface of the p-type silicon substrate 1 at, for example, $1.0 \times 10^{13}$ cm$^{-2}$ at 30 KeV, forming a p+-diffusion layer 5 (see FIG. 1b) in the surface of the silicon substrate 1 immediately below the opening. Thereafter, the photoresist 4 is removed.

As shown in FIG. 1c, a CVD silicon oxide film 6 having a thickness of about 100 nm is deposited as a third insulating film over the entire area of the polycrystalline silicon film 15.

The silicon oxide film 6 is then anisotropically etched to expose the upper surface of the polycrystalline silicon film 15, with a spacer being left composed of a CVD silicon oxide film 6a on the side walls of the opening as shown in FIG. 1d. At the same time, a portion of the silicon oxide film 2 which is not covered with the spacer is removed from the bottom of the opening, so that a p+-diffusion layer 5 is exposed which is self-aligned with the spacer.

Thereafter, the silicon substrate 1 is subjected to anisotropic etching to form a groove 7 (see FIG. 1e) having a depth of about 0.5 μm, the groove 7 extending through the p+-diffusion layer 5 and being self-aligned with the spacer. Simultaneously, the polycrystalline silicon film 15 is removed. Boron ions are injected perpendicularly into the surface of the p-type silicon substrate 1 at, for example, $1.0 \times 10^{13}$ cm$^{-2}$ at 30 KeV, forming a p+-diffusion layer 5a in the bottom of the opening. A CVD silicon oxide film 8 having a thickness of about 1 μm is then deposited as a fourth insulating film over the entire surface formed thus far.

The silicon oxide films 8, 14 are etched back until the upper surface of the polycrystalline silicon film 3 is exposed. The silicon oxide film 14 is now completely removed. The groove 7 is filled with the CVD silicon oxide film 8, which is joined to the spacer composed of a CVD silicon oxide film 6b (see FIG. 1f).

The polycrystalline silicon film 3 is then etched away. As shown in FIG. 1g, the groove 7 is filled with the silicon oxide film 8 as an insulating film, the p+-diffusion layer 5a being self-aligned with the groove 7. The silicon oxide films 8, 6b jointly provide a thick insulating film in and above the groove 7, for thereby suppressing a small leakage current along the groove 7.

The semiconductor device thus manufactured according to the process steps shown in FIGS. 1a through 1g is illustrated in FIG. 2.

An element isolation structure produced by selective epitaxy as disclosed in Japanese laid-open patent publication No. 224242/85 is shown in FIG. 3 of the accompanying drawings.

The element isolation structure shown in FIG. 3 is fabricated as follows: As shown in FIG. 3, a silicon oxide film 6 having a thickness of about 2 μm is formed on a p-type silicon substrate 1, and thereafter an area other than an element isolation area is etched away.

Subsequently, a silicon film is grown to a thickness of 2 μm on the surface of the silicon substrate 1 according to epitaxial growth, thus providing an epitaxial layer 13, and a transistor is formed therein. To form flat portions of the epitaxial layer 13, the silicon substrate 1 has a (100) face, and a pattern for etching away the thermally oxidized film is formed parallel to the (100) face.

The conventional semiconductor device shown in FIG. 2 is fabricated simply by introducing an impurity into the side walls of the groove. Such a process is disadvantageous in that it fails to suppress a leakage current along the side walls if an interconnection is positioned in an upper layer thereof. A small leakage current is suppressed by a structure in which the p+-diffusion layer is self-aligned with the groove and the thick insulating film is provided in and above the groove. However, such a structure is also problematic because as the source/drain n+-diffusion layer of a transistor is held in contact with the p+-diffusion layer, attempts to increase the density of the p+-diffusion layer and to minimize the small leakage current result in a reduction in the junction dielectric strength. Since the thick insulating film has vertical side walls, they will remain unremoved and cause a short circuit or increase the gate capacitance when a material of a gate electrode of a transistor is subsequently patterned.

The element isolation structure produced by selective epitaxy shown in FIG. 3 is also disadvantageous in that the junction leakage current is large because the source/drain n+-diffusion layer is formed in a facet.

SUMMARY OF THE INVENTION

It is an object of the present invention to provide a method of manufacturing a semiconductor device having a structure which will eliminate the conventional drawbacks and suppress leakage current in a silicon layer.

According to the present invention, the above object can be achieved by a method of manufacturing a semiconductor device, comprising the steps of:

successively forming a first insulating film and a first polycrystalline silicon film in superimposed relation on a silicon substrate, forming a photoresist having a shape covering an area other than an element isolation area on the first polycrystalline silicon film, etching away the first polycrystalline silicon film to form an opening, with the photoresist used as a mask, injecting ions through the opening and the first insulating film to form a diffusion layer which has the same impurity type as the silicon substrate in a surface of the silicon substrate which contains the element isolation area, removing the photoresist, forming a second insulating film on the entire surface formed so far, anisotropically etching the second insulating film and the first insulating film to form a spacer composed of the second insulating film on the side walls of the opening and remove the first insulating film from the bottom of the opening, anisotropically etching the silicon substrate to remove the first polycrystalline silicon film and form a groove in the silicon substrate in self-alignment with the spacer, forming a third insulating film over the entire surface formed so far, and anisotropically etching the third insulating film to remove the first insulating film from an area which is free of the third insulating film.

According to the present invention, there is also provided a method of manufacturing a semiconductor device, comprising the steps of:

forming a first insulating film on a silicon substrate, injecting ions through the first insulating film to form a first impurity-type diffusion layer in the surface of the silicon substrate, forming a second insulating film, etching away the second insulating film and the first insulating film from an area other than an element isolation area, selectively growing a silicon layer which is of the same impurity type as the silicon substrate in self-alignment with the first and second insulating films, to a height lower than the second insulating film, forming a third insulating film over the entire surface formed so far, and anisotropically etching the third insulating film to leave the third insulating film on the side walls of the second insulating film and cover a facet of the selectively grown silicon layer with the third insulating film.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 5b is a cross-sectional view taken along line A—A' of FIG. 5a;

FIG. 7b is a cross-sectional view taken along line B—B' of FIG. 7a.

DETAILED DESCRIPTION OF THE PREFERRED EMBODIMENTS

A method of manufacturing a semiconductor device according to a first embodiment of the present invention will first be described below with reference to FIGS. 4a through 4g.

Figure 1A:
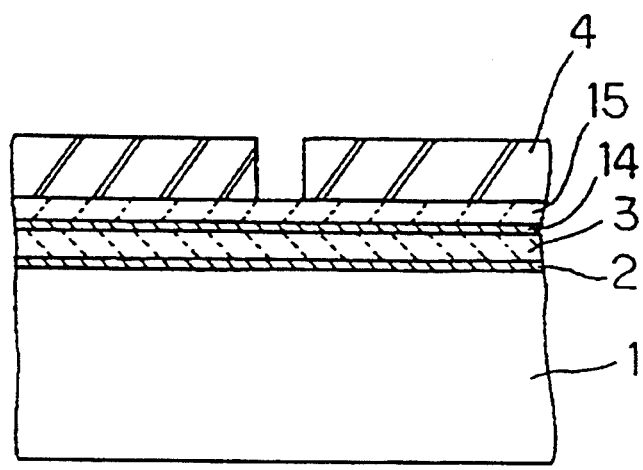
FIGS. 1a through 1g are vertical cross-sectional views showing successive steps of a conventional method of manufacturing a semiconductor device, FIG. 1a showing the step of alternately depositing oxide films and polycrystalline silicon films on a p-type silicon substrate to produce a four-layer structure, FIG. 1b showing the step of forming an opening and a p+-diffusion layer, FIG. 1c showing the step of depositing a CVD silicon oxide film, FIG. 1d showing the step of forming a spacer on the side walls of the opening, FIG. 1e showing the step of forming a groove, a p+-diffusion layer in the bottom of the groove, and a CVD silicon oxide film, FIG. 1f showing the step of filling the groove with a CVD silicon oxide film, and FIG. 1g showing the step of removing unnecessary films.
Figure 1B:
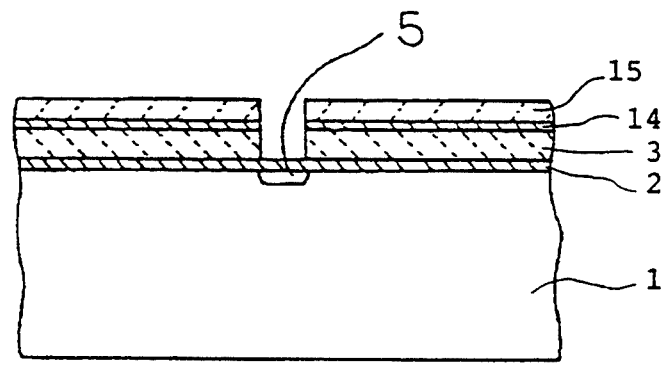
Figure 1C:
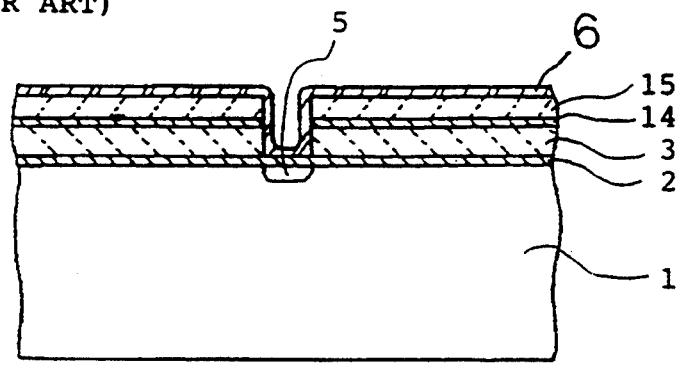
Figure 1D:
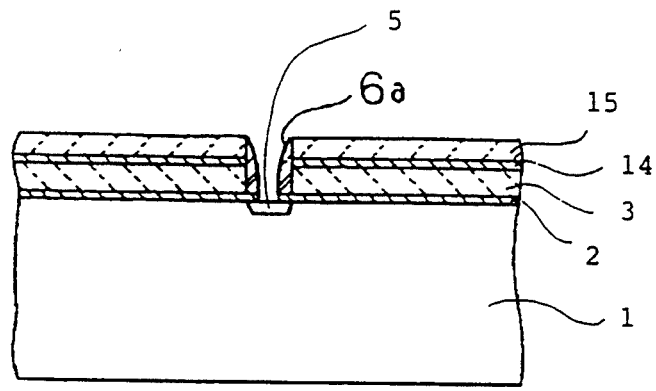
Figure 1E:
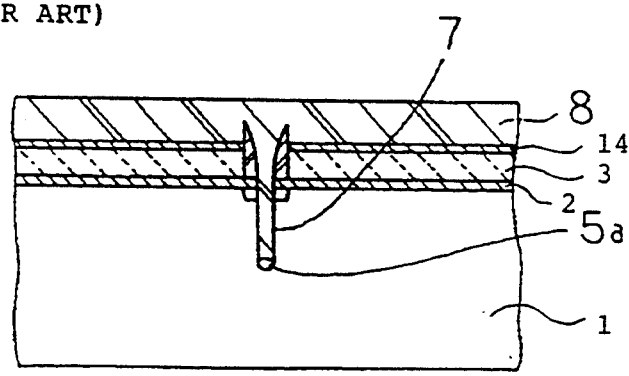
Figure 1F:
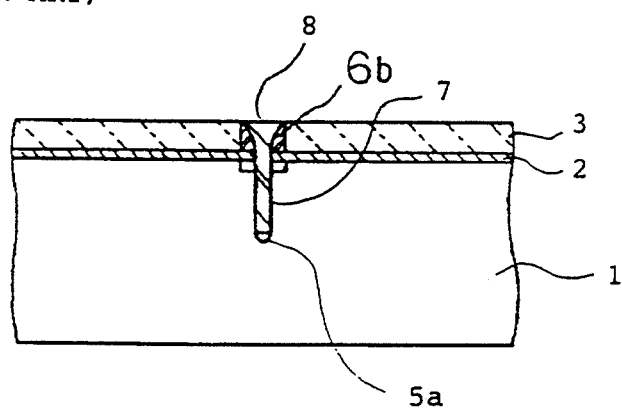
Figure 1G:
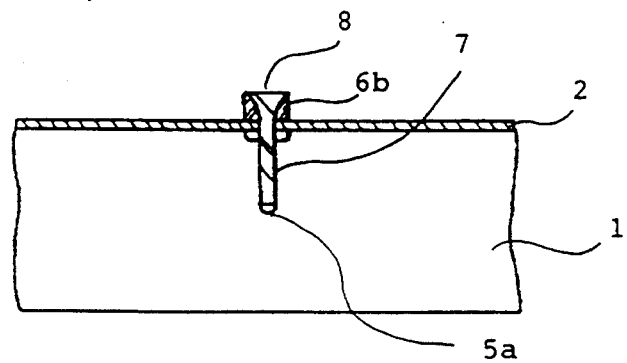
Figure 2:
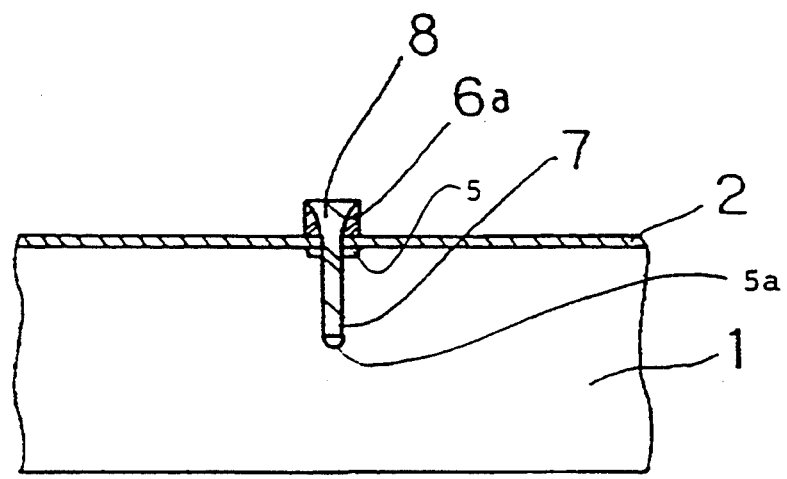
FIG. 2 is a vertical cross-sectional view of a semiconductor device which includes an element isolation groove, and which is manufactured by the method shown in FIGS. 1a through 1g.
Figure 3:
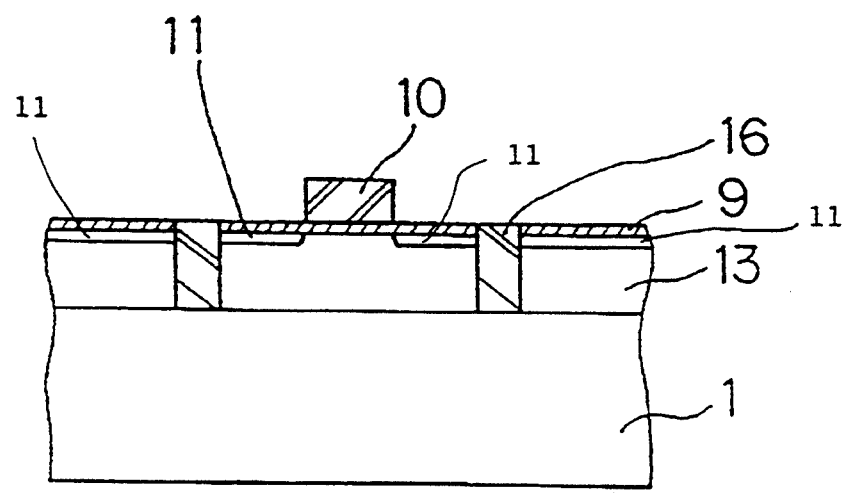
FIG. 3 is a vertical cross-sectional view of a conventional semiconductor device including an element isolation structure which employs a selectively grown silicon layer.
Figure 4A:
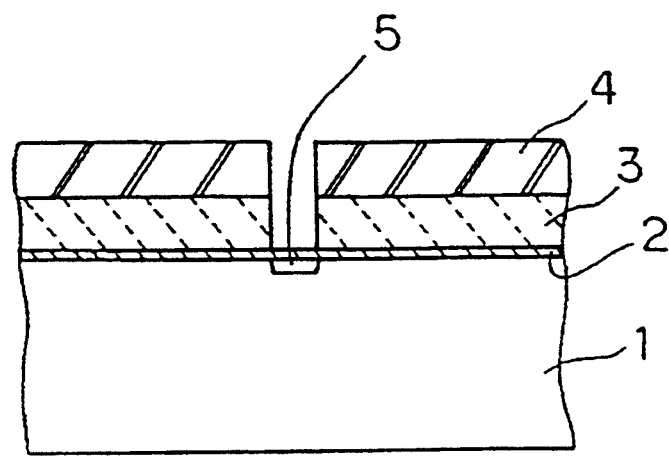
FIGS. 4a through 4g are vertical cross-sectional views showing successive steps of a method of manufacturing a semiconductor device according to a first embodiment of the present invention, FIG. 4a showing the step of forming a silicon oxide film as a first insulating film and a p+-diffusion layer in a surface of a substrate immediately below an opening, FIG. 4b showing the step of depositing a CVD silicon oxide film as a second insulating film, FIG. 4c showing the step of forming a spacer on the side walls of the opening, FIG. 4d showing the step of forming a groove, FIG. 4e showing the step of depositing a CVD silicon oxide film as a third insulating film, FIG. 4f showing the step of forming a CVD silicon oxide film as a side wall above the groove, and FIG. 4g showing the step of forming a gate oxide film, a polycrystalline silicon film, and an n+-diffusion layer.

As shown in FIG. 4a, a silicon oxide film 2 having a thickness of about 20 nm is formed as a first insulating film 2 on a p-type silicon substrate 1 by thermal oxidization, and then a polycrystalline silicon film 3 having a thickness of about 200 nm is deposited as a first polycrystalline silicon film on the silicon oxide film 2 by CVD. Thereafter, a photoresist 4 is deposited on the polycrystalline silicon film 3 to cover an area other than an element isolation area.

Using the photoresist 4 as a mask, a portion of the polycrystalline silicon film 3 is etched away, thus forming an opening with the silicon oxide film 2 exposed on the bottom thereof. Then, using the photoresist 4 again as a mask, ions of boron are injected into a surface of the p-type silicon substrate 1 at, for example, $1.0 \times 10^{13}$ cm$^{-2}$ at 30 KeV, forming a p+-diffusion layer 5 (see FIG. 4a) in the surface of the silicon substrate 1 immediately below the opening.

Figure 4B:
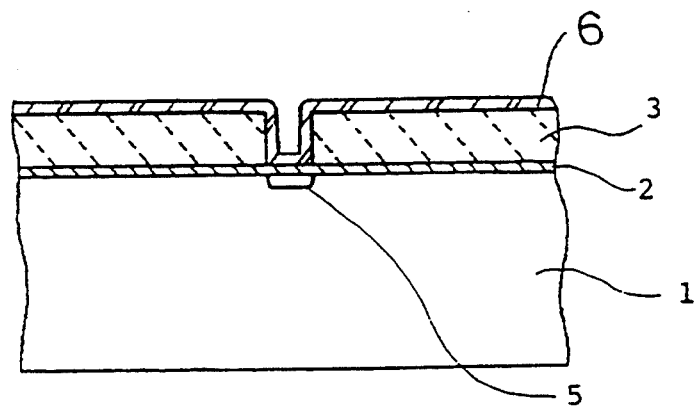

Thereafter, as shown in FIG. 4b, the photoresist 4 is removed, and a CVD silicon oxide film 6 having a thickness of about 50 nm is deposited as a second insulating film over the entire surface of the polycrystalline silicon film 3.

Figure 4C:
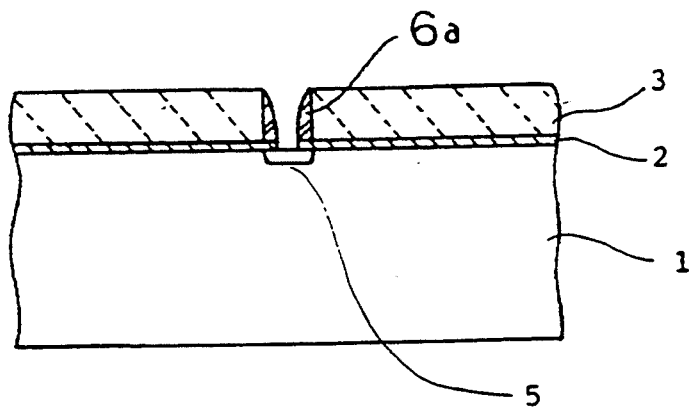
Figure 4D:
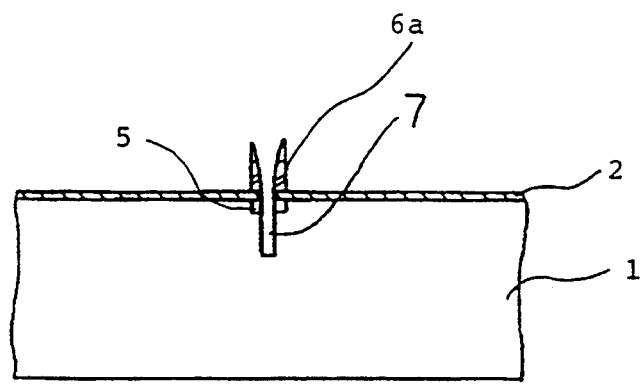

The silicon oxide film 6 is then anisotropically etched to expose the upper surface of the polycrystalline silicon film 3, with a spacer composed of a CVD silicon oxide film 6a being left on the side walls of the opening as shown in FIG. 4c. At the same time, a portion of the silicon oxide film 2 which is not covered with the spacer is removed from the bottom of the opening to expose a p+-diffusion layer 5 which is self-aligned with the spacer.

Thereafter, the silicon substrate 1 is subjected to anisotropic etching to form a groove 7 (see FIG. 4d) having a depth of about 0.5 μm, the groove 7 extending through the p+-diffusion layer 5 and being self-aligned with the spacer. Simultaneously, the polycrystalline silicon film 3 is removed.

Figure 4E:
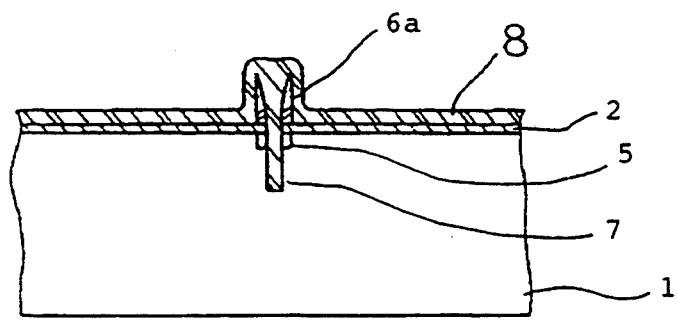
Figure 4F:
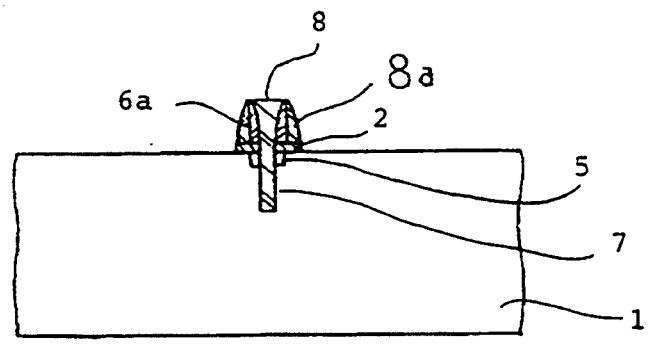

A CVD silicon oxide film 8 having a thickness of about 100 nm is then deposited as a third insulating film on the entire surface formed so far, as shown in FIG. 4e. If an element isolation area width is small, for example, 0.1 μm, the groove 7 is filled up with the silicon oxide film 8.

The silicon oxide film 8 is subjected to anisotropic etching, thereby forming a spacer composed of a CVD silicon oxide film 8a (see FIG. 4f) around the spacer of the CVD silicon oxide film 6a. Next, a thick insulating film in the form of a side wall self-aligned with the p+-diffusion layer 5 is formed above the groove 7.

Figure 4G:
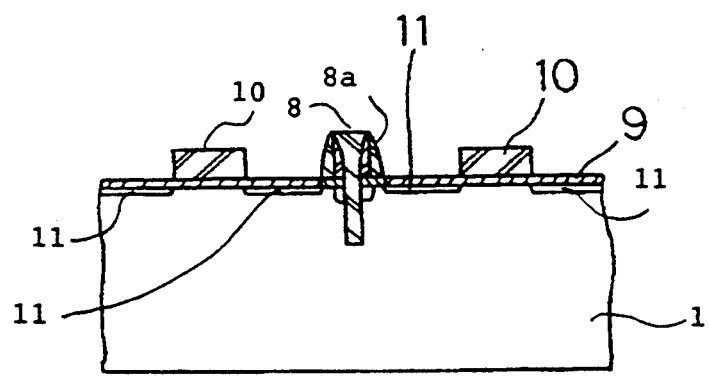

As shown in FIG. 4g, a gate oxide film 9 is deposited to a thickness of 8 nm on the silicon substrate 1, and a polycrystalline silicon film 10 is then deposited to a thickness of 200 nm on the gate oxide film 9. Thereafter, portions of the polycrystalline silicon film 10 other than portions which will serve as gate electrodes are etched away. As an impurity which is of the opposite impurity type of the silicon substrate 1, arsenic is then injected into the silicon substrate 1 at, for example, $1.0 \times 10^{15}$ cm$^{-2}$ at 30 KeV, thereby forming n+-diffusion layers 11. In this manner, an element isolation area is formed by the method according to the first embodiment of the present invention.

Figure 5A:
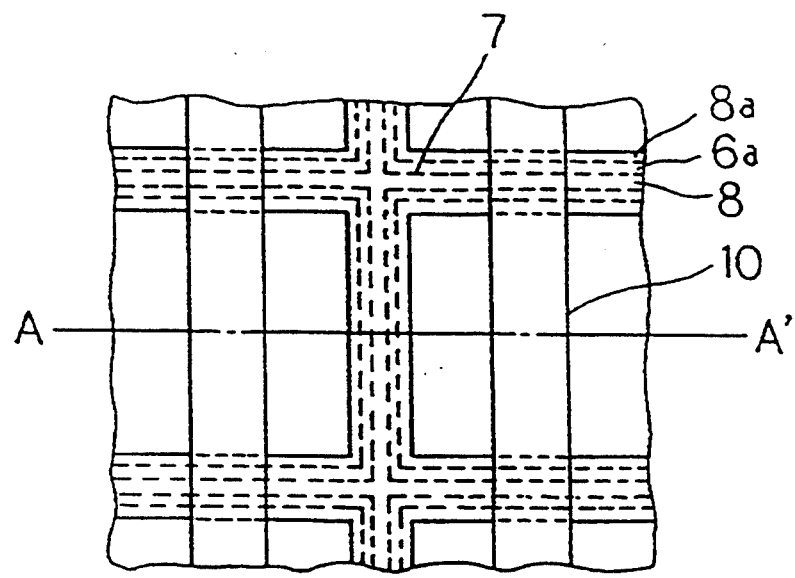
FIG. 5a is a fragmentary plan view of a semiconductor device manufactured by the method shown in FIGS. 4a through 4g.
Figure 5B:
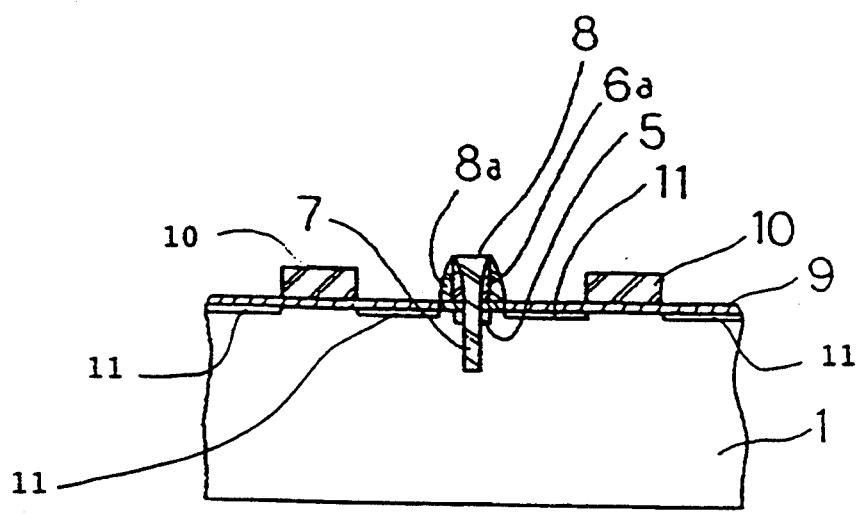

As shown in FIGS. 5a and 5b, the semiconductor device manufactured by the method shown in FIGS. 4a through 4g has a groove 7 defined in a silicon substrate 1 and a gate oxide film 9 disposed on the surface of the silicon substrate 1. A side wall 6a composed of a CVD silicon oxide film is disposed around the edge of the opening of the groove 7 and surrounded by a spacer composed of a CVD silicon oxide film 8a. The groove 7 surrounded by the side wall 6a is filled up with a CVD silicon oxide film 8 down to the bottom of the groove 7. Gate electrodes each composed of the polycrystalline silicon film 10 are disposed on the gate oxide film 9 in a spaced relation to the spacer 8a. The silicon substrate 1 has a n+-diffusion layers 11 and a p+-diffusion layer 5 disposed therein. Since the n+-diffusion layers 11 have terminal edges spaced from terminal edges of the p+-diffusion layer 5, any leakage current between these terminal edges is suppressed to a small level.

In the illustrated method according to the first embodiment, the p+-diffusion layer 5 is formed in the step shown in FIG. 4a. However, it is possible to form a p+-diffusion layer entirely in the groove 7 by diffusing boron in the groove 7 in the step shown in FIG. 4d.

A method of manufacturing a semiconductor device according to a second embodiment of the present invention will next be described below with reference to FIGS. 6a through 6f.

Figure 6A:
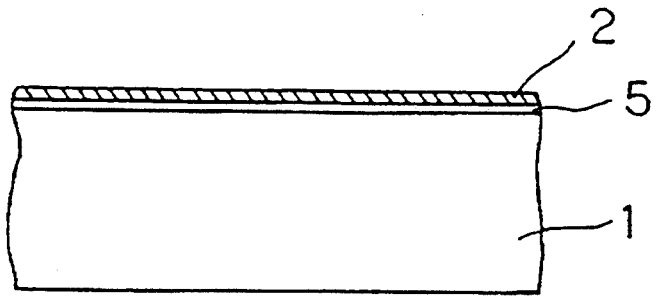
FIGS. 6a through 6f are vertical cross-sectional views showing successive steps of a method of manufacturing a semiconductor device according to a second embodiment of the present invention, FIG. 6a showing the step of forming a silicon oxide film as a first insulating film and a p+-diffusion layer, FIG. 6b showing the step of forming a CVD silicon oxide film as a second insulating film on the p+-diffusion layer, FIG. 6c showing the step of selectively growing a p-type silicon layer, FIG. 6d showing the step of depositing a CVD silicon oxide film, FIG. 6e showing the step of forming a CVD silicon oxide film as the side walls on the silicon oxide film as the second insulating film, and FIG. 6f showing the step of forming a gate oxide film, a polycrystalline silicon film, and an n+-diffusion layer.

As shown in FIG. 6a, a silicon oxide film 2 having a thickness of about 20 nm is formed as a first insulating film 2 on a p-type silicon substrate 1 by thermal oxidization. Thereafter, ions of boron are injected into a surface of the p-type silicon substrate 1 at, for example, $1.0 \times 10^{13}$ cm$^{-2}$ at 30 KeV, forming a p+-diffusion layer 5 in the surface of the silicon substrate 1.

Figure 6B:
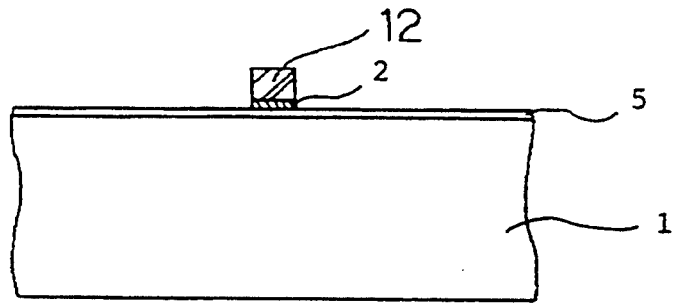

Then, as shown in FIG. 6b, a CVD silicon oxide film 12 having a thickness of about 400 nm is deposited as a second insulating film on the silicon oxide film 2. Thereafter, portions of the CVD silicon oxide film 12 and the silicon oxide film 2 other than an element isolation area are etched away.

Figure 6C:
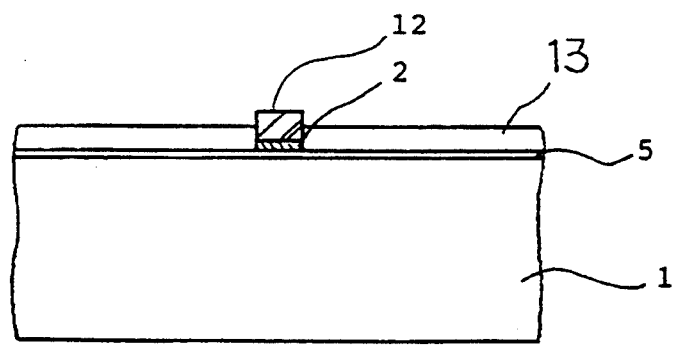

A p-type silicon layer 13 is then selectively grown to a thickness of about 0.2 μm on the exposed surface of the silicon substrate 1, as shown in FIG. 6c.

Figure 6D:
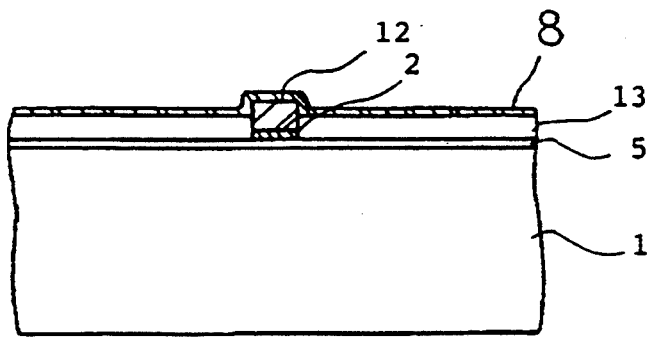

A CVD silicon oxide film 8 having a thickness of about 100 nm is next deposited as a third insulating film on the entire surface formed so far, as shown in FIG. 6d.

Figure 6E:
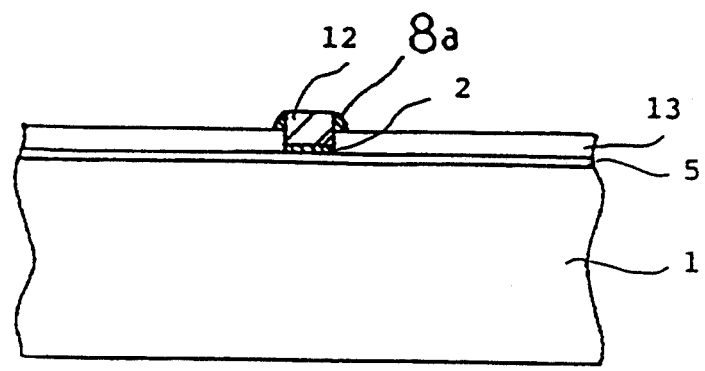

The CVD silicon oxide film 8 is subjected to anisotropic etching, thus forming a CVD silicon oxide film 8a as the side walls of the CVD silicon oxide film 12, as shown in FIG. 6e. Next, a facet of the silicon layer 13, which is produced on the side wall of the CVD silicon oxide film 12 upon the selective growth of the silicon layer 13, is covered with the CVD silicon oxide film 8a.

Figure 6F:
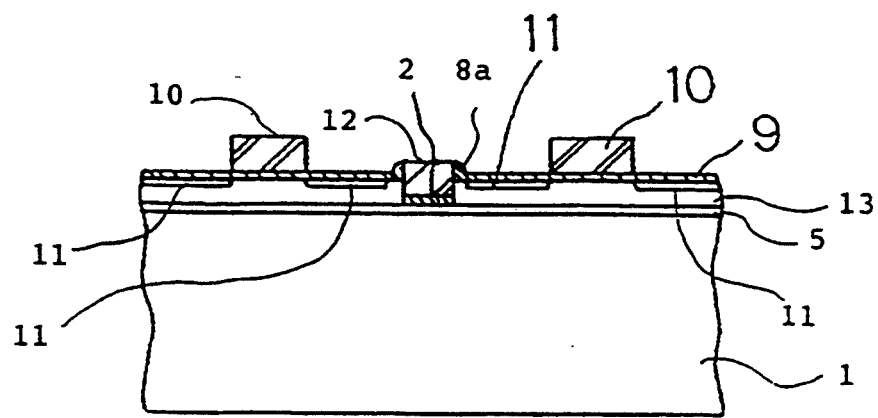

Then, as shown in FIG. 6f, a gate oxide film 9 is deposited to a thickness of 8 nm on the p-type silicon substrate 13, and a polycrystalline silicon film 10 is deposited to a thickness of 200 nm on the gate oxide film 9. Thereafter, portions of the polycrystalline silicon film 10 other than portions which will serve as gate electrodes are etched away. As an impurity which is of the opposite impurity type of the silicon layer 13, arsenic is then injected into the silicon layer 13 at, for example, $1.0 \times 10^{15}$ cm$^{-2}$ at 30 KeV, thereby forming n+-diffusion layers 11. In this manner, an element isolation area has been formed by the method according to the second embodiment of the present invention.

Figure 7A:
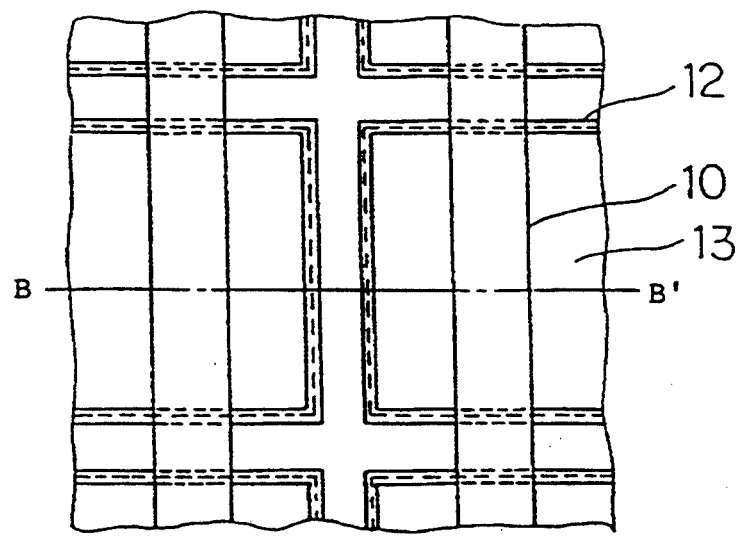
FIG. 7a is a fragmentary plan view of a semiconductor device manufactured by the method shown in FIGS. 6a through 6f.
Figure 7B:
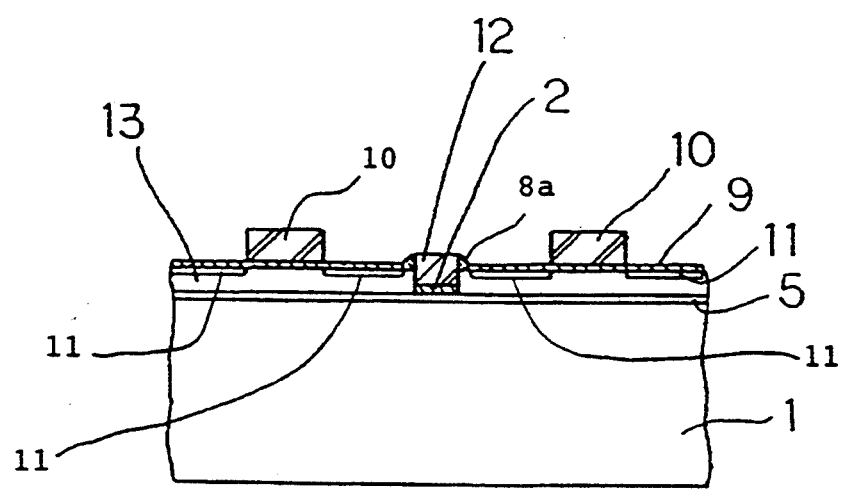

As shown in FIGS. 7a and 7b, the semiconductor device manufactured by the method shown in FIGS. 6a through 6f is composed of a p-type silicon substrate 1, a silicon oxide film 2, a p+-diffusion layer 5, a gate oxide film 9, polycrystalline silicon films 10, n+-diffusion layers 11, a CVD silicon oxide film 12, and a p-type selectively grown silicon layer 13. In the semiconductor device, elements are isolated from each other by an insulating film. A facet of the silicon layer 13, which is produced on the side walls of the CVD silicon oxide film or insulating film 12 on the silicon substrate 1 when the silicon layer 13 is selectively grown, is covered with a side wall insulating film 8a which is formed in self-alignment with the side walls of the insulating film 12. The side wall insulating film 8a has edges spaced outwardly from the edges of the facet of the silicon layer 13.

The method according to each of the first and second embodiments of the present invention is directed to the isolation of an n+-diffusion layer. However, the principles of the present invention are also applicable to the isolation of a p+-diffusion layer insofar as the opposite impurity type is employed.

With the present invention, as described above, a semiconductor device is manufactured in which an element is isolated by an insulating film such as a silicon layer that is selectively grown with respect to either a groove defined in a silicon substrate and filled with an insulating film or an insulating film disposed on a silicon substrate. In such a semiconductor device, a thick insulating film is formed on the groove or the selectively grown silicon layer in self-alignment therewith, and shaped as a side wall. Therefore, a diffusion layer for suppressing leakage current along the side walls of the groove can be spaced from a source/drain diffusion layer in self-alignment therewith. Since the source/drain diffusion layer need not be formed on a facet of the selectively grown silicon layer, any leakage current can be further reduced, and the dielectric strength can be increased. It is also possible to prevent incomplete etching of the side wall of the thick insulating wall upon formation of electrodes in a subsequent step.

Although certain preferred embodiments of the present invention has been shown and described in detail, it should be understood that various changes and modifications may be made therein without departing from the scope of the appended claims.

What is claimed is:

1. A method of manufacturing a semiconductor device, comprising the steps of:
   successively forming a first insulating film and a first polycrystalline silicon film in superimposed relation on a silicon substrate;
   forming a photoresist having a shape covering an area other than an element isolation area on said first polycrystalline silicon film;
   etching away said first polycrystalline silicon film to form an opening, with said photoresist used as a mask;
   injecting ions through said opening and said first insulating film to form a diffusion layer which has the same impurity type as said silicon substrate in a surface of said silicon substrate which contains said element isolation area;
   removing said photoresist;
   forming a second insulating film over the entire surface formed thus far;
   anisotropically etching said second insulating film and said first insulating film to form a spacer composed of said second insulating film on side walls of said opening and remove said first insulating film from the bottom of said opening;
   anisotropically etching said silicon substrate to remove said first polycrystalline silicon film and form a groove in said silicon substrate in self-alignment with said spacer;
   forming a third insulating film on the entire surface formed thus far; and
   anisotropically etching said third insulating film to remove the first insulating film from an area which is free of said third insulating film.

2. A method of manufacturing a semiconductor device, comprising the steps of:
   forming a first insulating film on a silicon substrate;
   injecting ions through said first insulating film to form a first impurity-type diffusion layer in a surface of said silicon substrate;
   forming a second insulating film;
   etching away said second insulating film and said first insulating film from an area other than an element isolation area;
   selectively growing a silicon layer which is of the same impurity type as said silicon substrate in self-alignment with said first and second insulating films, to a height lower than said second insulating film;
   forming a third insulating film on the entire surface formed thus far; and
   anisotropically etching said third insulating film to leave the third insulating film on side walls of said second insulating film and cover a facet of the selectively grown silicon layer with said third insulating film.

* * * * *

UNITED STATES PATENT AND TRADEMARK OFFICE
CERTIFICATE OF CORRECTION

PATENT NO.    : 5,447,883
DATED         : September 5, 1995
INVENTOR(S)   : Kuniaki KOYAMA It is certified that error(s) appears in the above-identified patent and that said Letters Patent is hereby corrected as shown below:

Col. 5, line 28, delete "$cm^{31\ 2}$", insert --$cm^{-2}$--.

Signed and Sealed this

Sixth Day of August, 1996

Attest:

BRUCE LEHMAN

Attesting Officer

Commissioner of Patents and Trademarks